(12) United States Patent
Aoki et al.

(10) Patent No.: US 6,177,916 B1
(45) Date of Patent: Jan. 23, 2001

(54) INTEGRATED DRIVER CIRCUIT TYPE LIQUID CRYSTAL DISPLAY DEVICE

(75) Inventors: Yoshiro Aoki; Masao Karube, both of Saitama-ken (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/033,645

(22) Filed: Mar. 3, 1998

(30) Foreign Application Priority Data

Mar. 3, 1997 (JP) .................................................. 9-047903

(51) Int. Cl.[7] ........................................................ G09G 3/36
(52) U.S. Cl. .............................. 345/87; 345/206; 349/140
(58) Field of Search ........................... 345/87, 205, 206; 349/139, 149, 151, 140, 152

(56) References Cited

U.S. PATENT DOCUMENTS 5,841,414 * 11/1998 Tanaka .................................. 345/206
5,945,984 * 8/1999 Kuwashiro ............................ 345/206

* cited by examiner

*Primary Examiner*—Dennis-Doon Chow
(74) *Attorney, Agent, or Firm*—Oblon, Spivak, McClelland, Maier & Neustadt, P.C.

(57) ABSTRACT

Buffer circuits and analogue switches are disposed closer to a display region than video busses. A timing signal generator circuit provides the buffer circuits with a timing signal. The analogue switches supply video signals from the video busses to signal lines in the display region in response to the timing signal. Parasitic capacitance coupled to the video busses is reduced so that bandwidth characteristics of the busses can be improved and a good display can be also obtained.

8 Claims, 7 Drawing Sheets

INTEGRATED DRIVER CIRCUIT TYPE LIQUID CRYSTAL DISPLAY DEVICE

BACKGROUND OF THE INVENTION

1. Field of the Invention

This invention relate to a flat panel display device, such as a liquid crystal display device and, in particular, an integrated driver circuit type liquid crystal display device in which an image display unit is integrated with a driver circuit on a common substrate.

2. Discussion of the Background

An integrated driver circuit type liquid crystal display device is a monolithic semiconductor formed on a glass substrate. The liquid crystal display device includes a plurality of scanning lines, a plurality of signal lines crossing the scanning lines at right angles to define cross points, pixel electrodes disposed in the vicinities of the cross points and, scanning and video signal driver circuits to supply scanning and video signals to the scanning and signal lines, respectively.

The signal driver circuit essentially has timing signal generators to control a timing thereof, a buffer circuit to amplify the timing signal from the timing circuits, video signal busses supplied with video signals from external equipment, and analogue switches for video signal distribution to sample the video signals of the video signal busses and transfer the same to the signal lines in response to outputs from the buffer circuits.

In a conventional integrated driver circuit liquid crystal display device, driving loads increase as the display size becomes larger and decreases an operation margin due to the higher definition bring about a poorer video signal bandwidth. In order to overcome those technical problems the analogue switches connected to a plurality of the signal lines are controlled in accordance with a common timing signal and a plurality of the video signal busses are provided to supply a different video signal to each analogue switch. As a consequence, permissible sampling periods become much longer than in the case that the analogue switches are individually controlled in accordance with different timing signals and video signals can be sufficiently sampled.

Since an allocated sampling time becomes shorter as the display size is larger and/or the display definition is higher, more analogue switches are controlled at same timing so that the number of video signal busses is apt to increase.

The area occupied by a signal bus driver circuit on a glass substrate becomes larger and the effective display area of a display device decreases in accordance with the increase of the number of prior art video signal busses.

SUMMARY OF THE INVENTION

An object of the present invention is to provide an integrated driver circuit type liquid crystal display device which is capable of securing a sufficient video signal bandwidth without an increase of the area occupied by a signal line driver circuit.

According to the present invention, buffer circuits and analogue switches are disposed between video signal busses and signal lines in a video display region of an integrated driver circuit type liquid crystal display device. Further, control terminals at groups of the analogue switches are connected to the buffer circuits which, in turn, are commonly coupled to single output signal lines of the timing signal generator circuits, respectively. The analogue switches are also connected between video signal busses and signal lines in the video display region. The analogue switches distribute video signals of the video busses to the signal lines in a video display region in response to the sampling pulses supplied to the control terminals thereof from the timing signal generator circuits.

This structure minimizes the area in which the single output signal line only crosses the video signal busses in the case that the timing signal generator circuit is disposed outside the busses. Also, it is not necessary for the single output signal line to cross the busses and no crossing area is needed where the timing signal generator circuit is provided inside the busses. Those arrangements reduce parasitic or stray capacitance at the video signal busses and can provide the basses with sufficiently broad bandwidth characteristics.

The above-stated and other objects and advantages of the invention will become apparent from the following description when taken with the accompanying drawings. It is understood, however, that the drawings are for purposes of illustration and are not to be construed as defining the scope or limits of the invention, reference being had for the latter purpose to the claims appended hereto.

DETAIL DESCRIPTION OF THE PREFERRED EMBODIMENT

Figure 1:
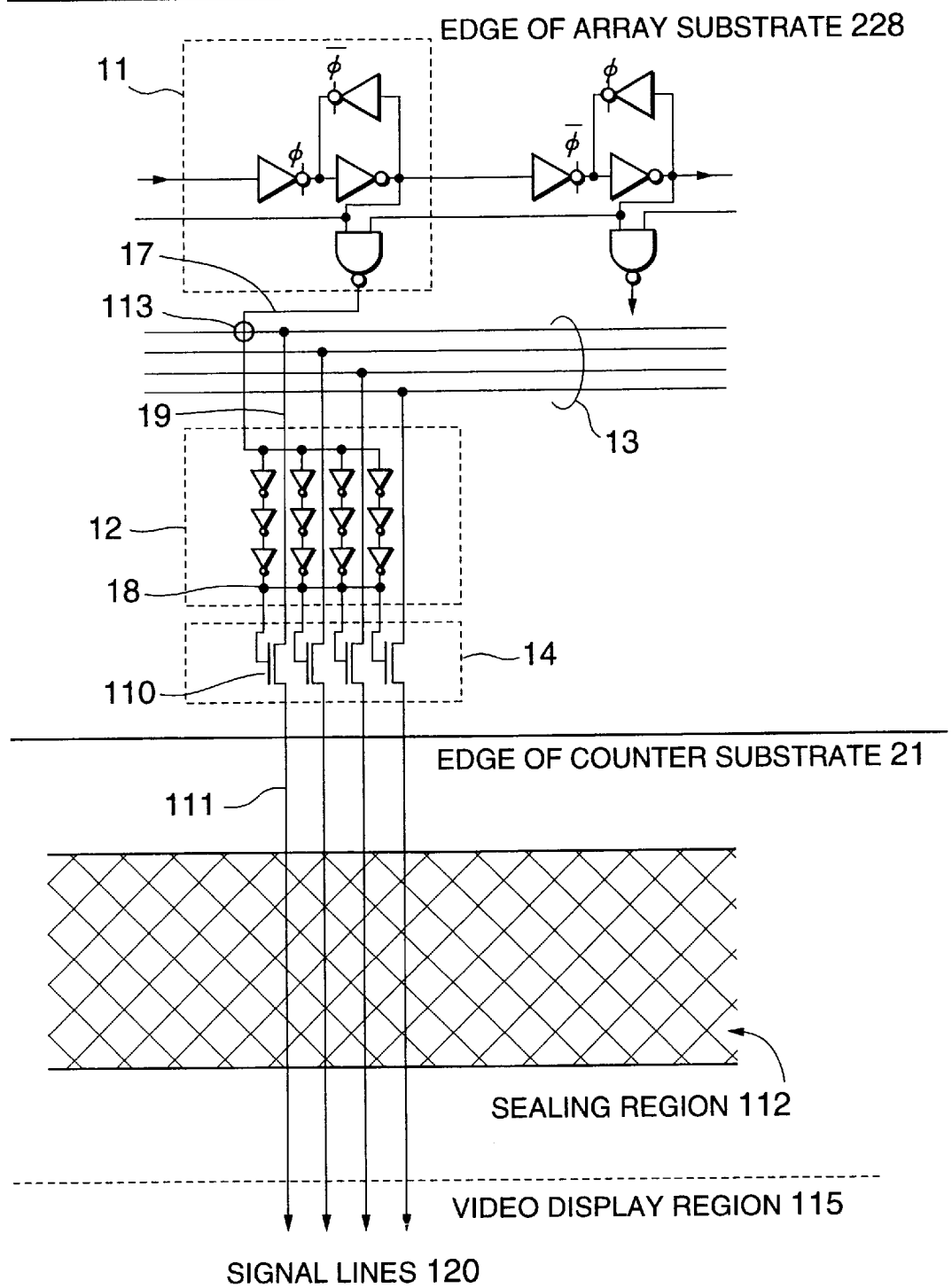
FIG. 1 is a schematic circuit diagram of a signal line driver circuit in an integrated driver circuit type liquid crystal display device of a first embodiment according to the present invention.
Figure 2:
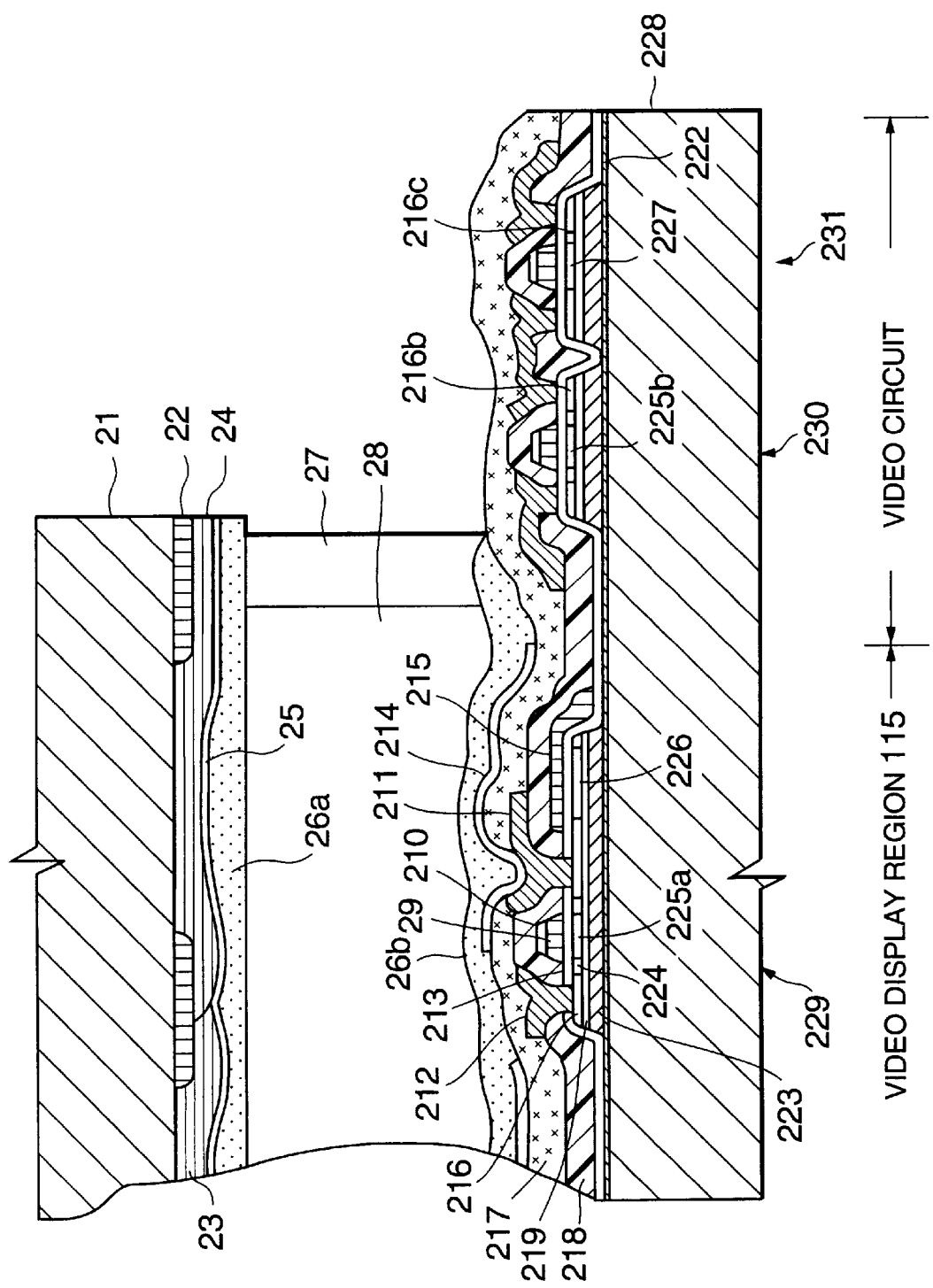
FIG. 2 is a partial cross sectional view of the liquid crystal display device shown in FIG. 1.

FIGS. 1 and 2 are a circuit diagram of a signal line driver circuit of a first embodiment according to the present invention and a partial cross sectional view to show the structure of a liquid crystal display device associated with the driver circuit shown in FIG. 1, respectively.

A production method of the integrated driver circuit type liquid crystal display device will be described hereinafter with reference to FIG. 2. An insulation undercoat film 222 made of SiNx, $SiO_2$ or the like is formed on an array insulation substrate 228 by using a plasma CVD method or an atmospheric pressure CVD method. The undercoat film 222 reduces an influence of impurities on the substrate 228 or therein. A first a-Si layer 223 is formed on the undercoat film 222 by using the plasma CVD. The a-Si layer 223 is then annealed to decrease hydrogen therein. This a-Si layer 223 is provided for a light blocking layer. A SiNx layer 219 and a second a-Si layer 216 are successively formed on the a-Si layer 223 by using the CVD method. After being subjected to a dehydrogenation process, the a-Si layer is further annealed for polycrystallization by means of excimer laser. As a result, the a-Si layer becomes an active polycrystalline layer 223. Photo-engraving and etching processes are applied to the active layer for patterning and device isolation. Thus, the active layer 223 are made into channel layers 225b and 227 for active elements (thin film transistors for circuits) in the driving circuit, a channel layer 225a for pixel switching elements (thin film transistors for pixels) in a display region, and storage capacitor electrodes 226 for pixels.

Gate and storage capacitor insulation layers 213 made of $SiO_2$ are formed by using the atmospheric pressure CVD. The layers 213 are processed with high temperature and become minute and less in defect.

MoW (molybdenum tungsten) alloy thin films are formed by making use of a sputtering method. Photo-engraving and patterning processes are applied to form laminated gate electrodes 29 and 210 and storage capacitor lines 215.

A photoresist or Al patterning is then performed to make masks for doping impurities. Source and drain electrodes 216 and 226 and light doped drain regions 225a are formed by doping P-type impurities into the layer 216 through the masks, the substrate 228 is then annealed to activate the doped impurities, and P-type thin film transistor 229 is finally formed. Similarly, P -and N-type impurities of boron and phosphorus are doped into the layers 216b and 216c through masks, respectively, the substrate 228 is then annealed to activate the impurities, and P- and N-type thin film transistors 230 and 231 are formed as driver circuits.

The atmospheric pressure CVD is applied to form a $SiO_2$ layer 218 as a first lamination insulator. After contact holes are perforated, the sputtering method is used to form an Al layer. Patterning of the Al layer is carried out through the photo-engraving and etching processes to make electrodes 211 and 212 contacted to the source and drain electrodes and various lines, e.g., signal lines.

The plasma CVD is used to form a protection layer made of SiNx as a second lamination insulator 217. After contact holes are perforated, the sputtering method is applied to make a transparent conductive layer made of indium tin oxide (ITO). A patterning process is performed to make the layer into a pixel electrode 214 by etching it. In addition, an alignment layer 26b is coated on the electrode 214 and the patterned remaining surface.

Figure 6:
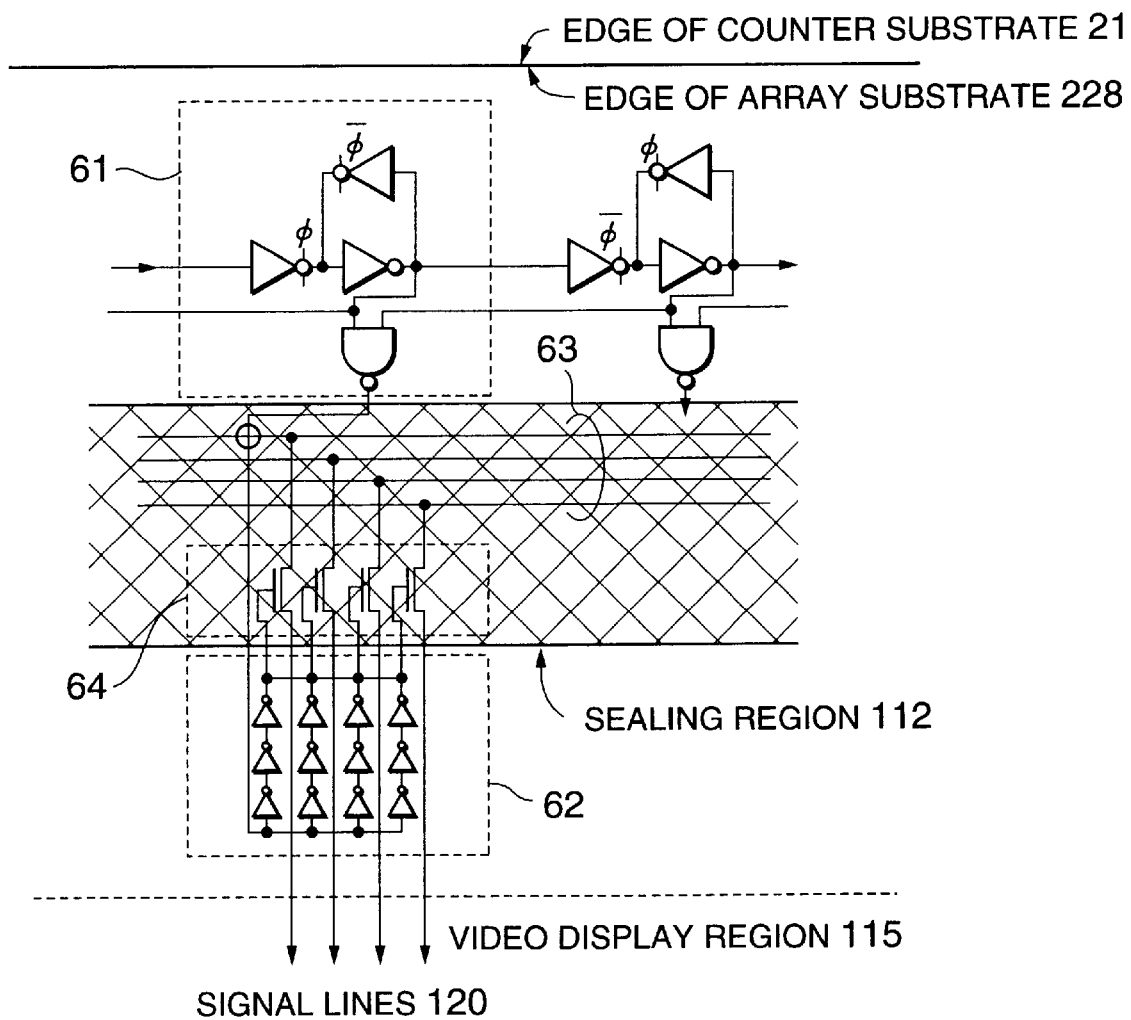
Figure 7:
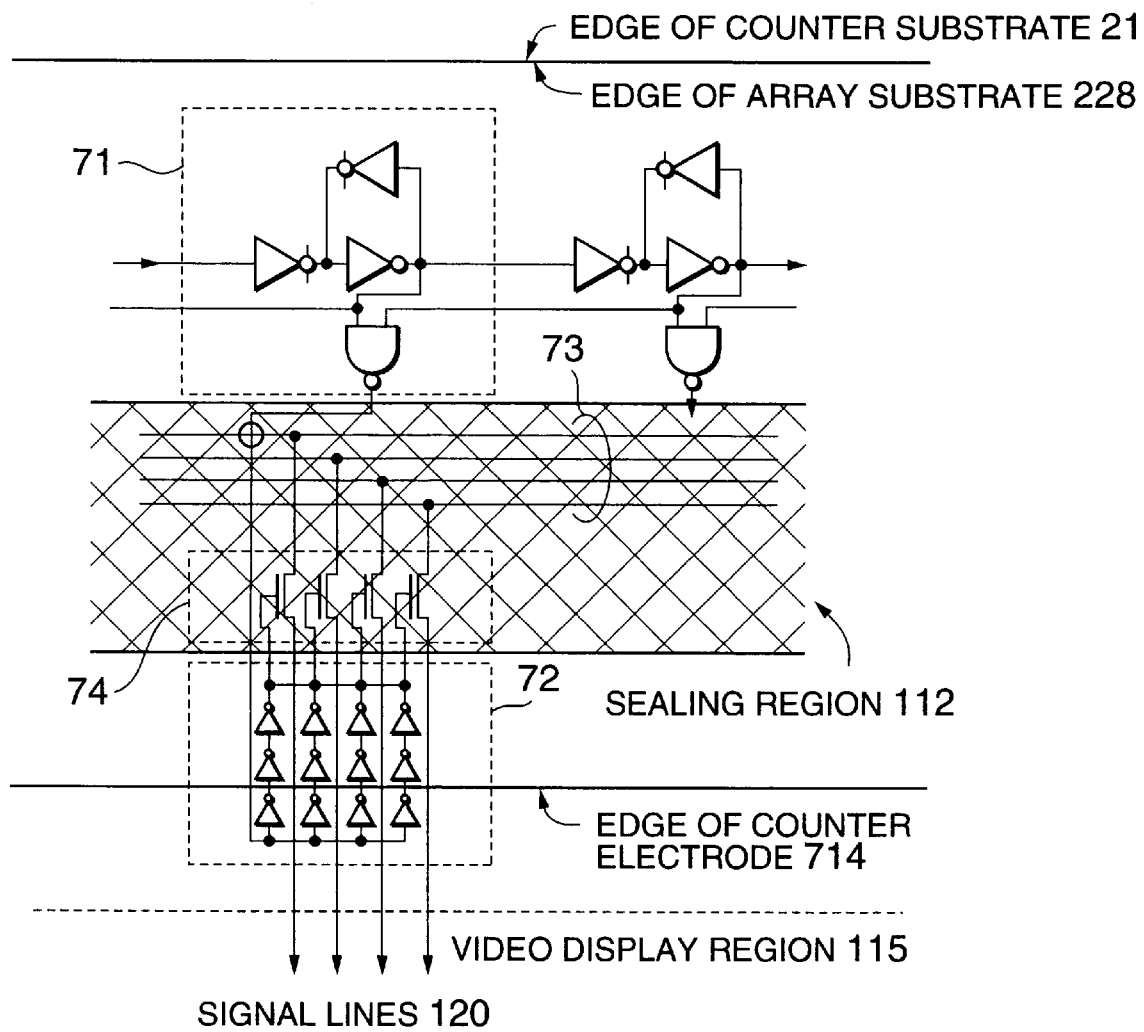

A counter substrate 21 is provided with black matrix layers 22, color filter layers 23, a counter electrode 25 made of ITO thereon and an alignment layer 26a on the electrode 25. A liquid crystal material 28 is held in a gap defined between the array and counter substrates 228 and 21. The gap is sealed by a sealing material 27. The counter substrate 21 is overlapped with the array substrate 228 up to the video display region but may extend to cover the array substrate 228 entirely (as shown in FIGS. 6 and 7).

The gate and storage capacitor lines made of MoW may be also used as masks for doping impurities. In this case, the lower gate electrode 29, for instance, can be used as the masks for doping N-type impurity while the upper electrode 210 as those for doping P-type impurity. In this way, P- and N-type thin film transistors are formed independently.

Through the processes set forth above, the integrated driver circuit type liquid crystal display device is produced. As shown in FIG. 1, the counter substrate 21 extends up to a sealing region 112 of the array substrate 228. The driver circuits are disposed in the remaining region of the array substrate 228. Parallel connected buffer circuits 12 and analogue switches 14 for video signal distributions are provided inside video busses 13 but a timing signal generator circuit 11 is outside the video busses 13. An output signal from the timing signal generator circuit 11 is supplied at the same timing to the analogue switches 14 through the buffer circuits 12. An output signal line 17 of the timing signal generator circuit 11 is crossed with the video busses 13 at the point 113 (on the side of the video display region).

Output lines 18 of the buffer circuits 12 are connected to the gates 110 of the analogue switches 14 so that the buffer circuits 12 distribute the timing signal to the gates 110 of the analogue switches 14. The output signal lines 18 are connected with each other so as to transmit the timing signal to the switches 110 uniformly and quickly. The video busses 13 are connected to the analogue switches 14 through output lines 19, respectively. The analogue switches 14 supplies video signals to the signal lines 120 in response to the timing signal. The structure can reduce parasitic capacitance loads so that the bandwidth characteristics of the video busses are prevented from becoming poor even where the number of the video busses increases.

Figure 3:
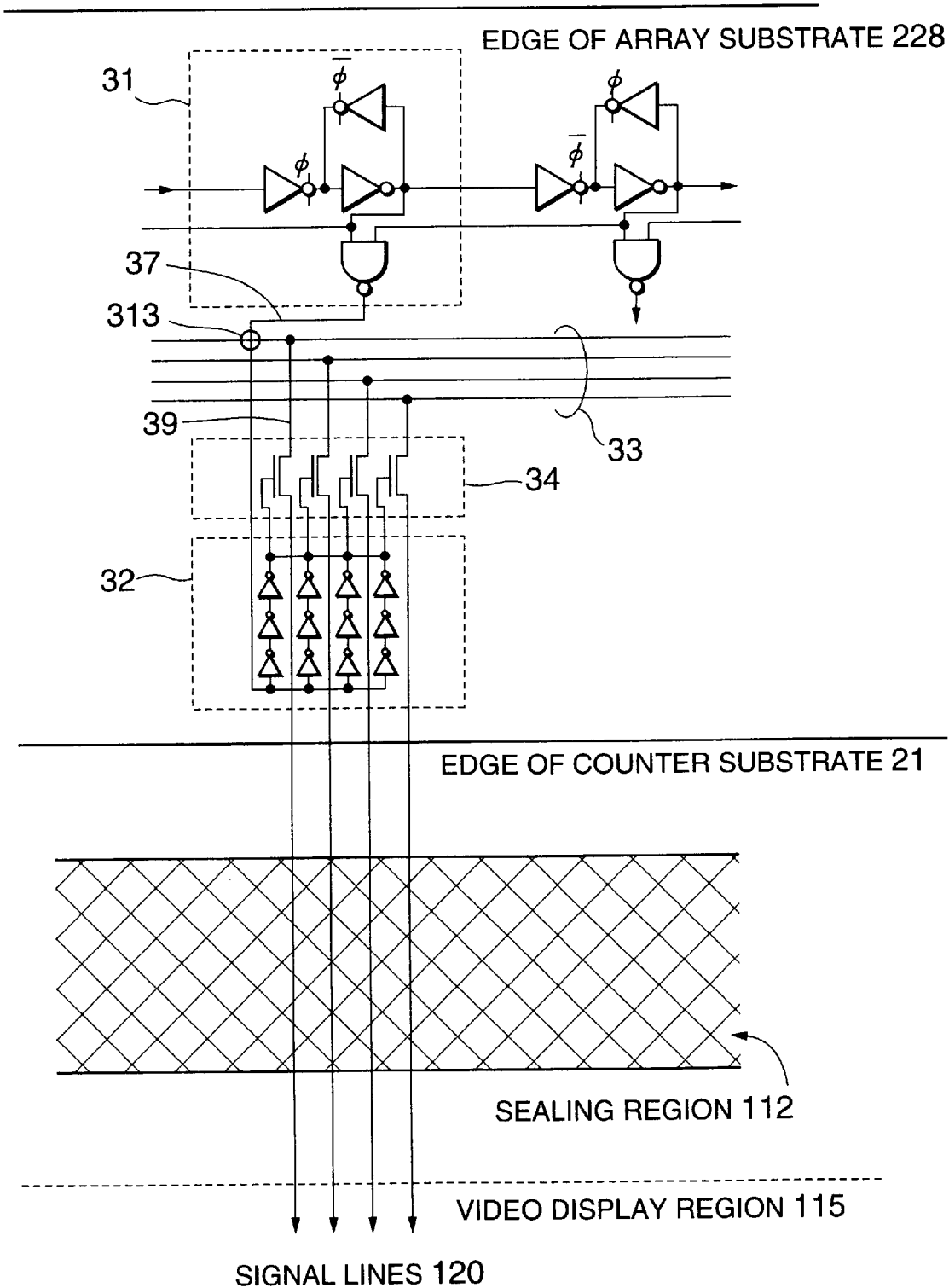
FIGS. 3 through 7 are schematic circuit diagrams of signal line driver circuits in the liquid crystal display device of second through sixth embodiments according to the invention.

FIG. 3 shows a second embodiment signal line driving circuit of an integrated driver circuit type liquid crystal display device according to the present invention. Although the structure of the array and counter substrate is similar to that of the first embodiment, buffer circuits 32 in the signal line driving circuit is much closer to the video display region 115 than analogue switches 34.

Since a single output line 37 of a timing signal generator circuit 31 is only crossed with video busses 33 at a point 313 as in the first embodiment, parasitic capacitance loads can be reduced. In addition, lead lines connected between the busses and analogue switches are more shortened so that the lines have less parasitic capacitance. As a result, the bandwidth characteristics of the busses can be improved.

Figure 4:
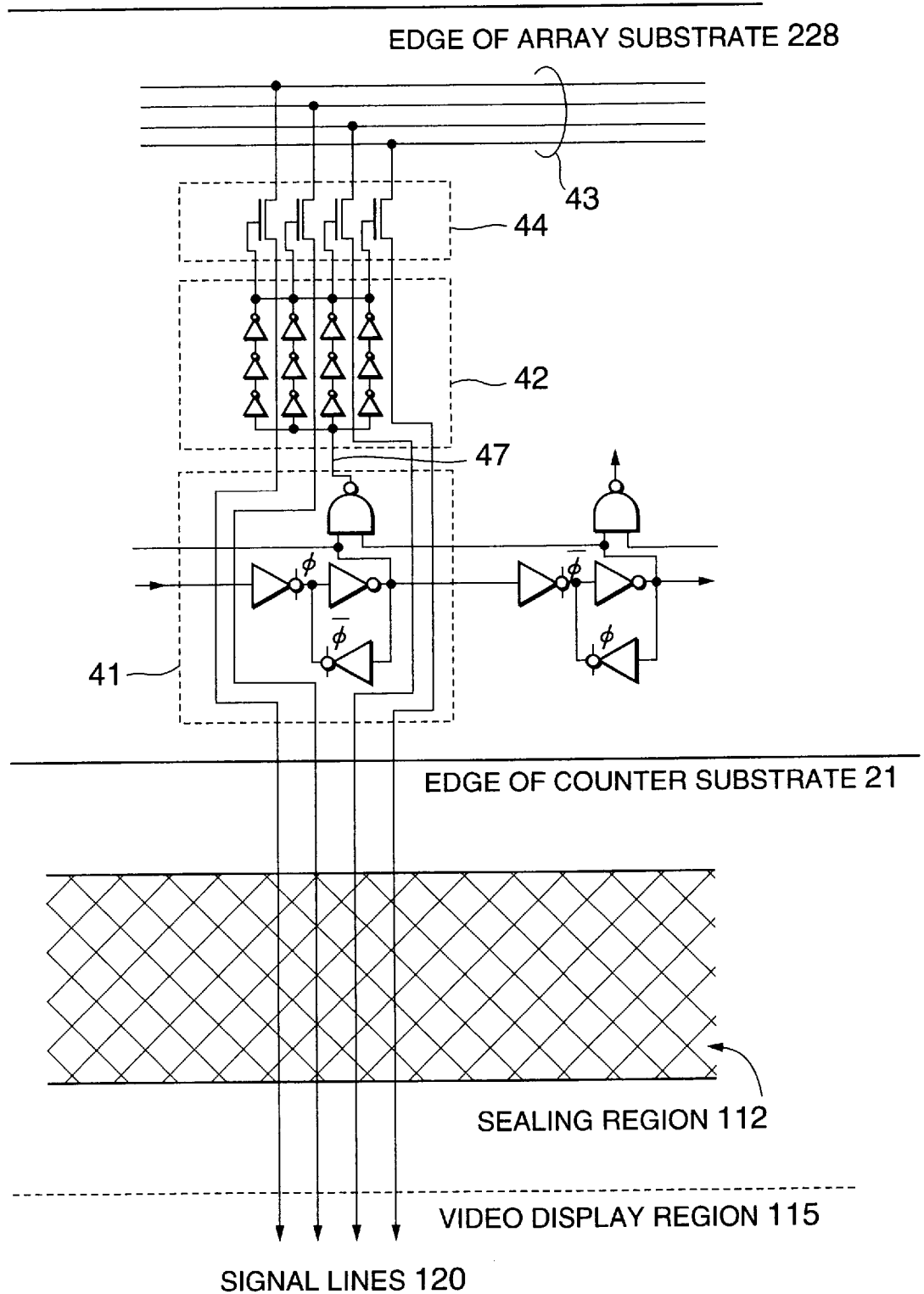

FIG. 4 shows a third embodiment signal line driving circuit of an integrated driver circuit type liquid crystal display device according to the present invention. A timing signal generator circuit 41 is disposed on the inside of video busses 43. With this structure, a single output line 47 of the timing signal generator circuit 41 can be connected to buffer circuits 42 without overlap of video busses 43. Analogue switches 44, however, are still controlled in accordance with a timing signal supplied from the buffer circuits 42. Parasitic capacitance associated with the busses 43 are less than the first and second embodiments. As a result, the bandwidth characteristics of the busses can be further improved.

Figure 5:
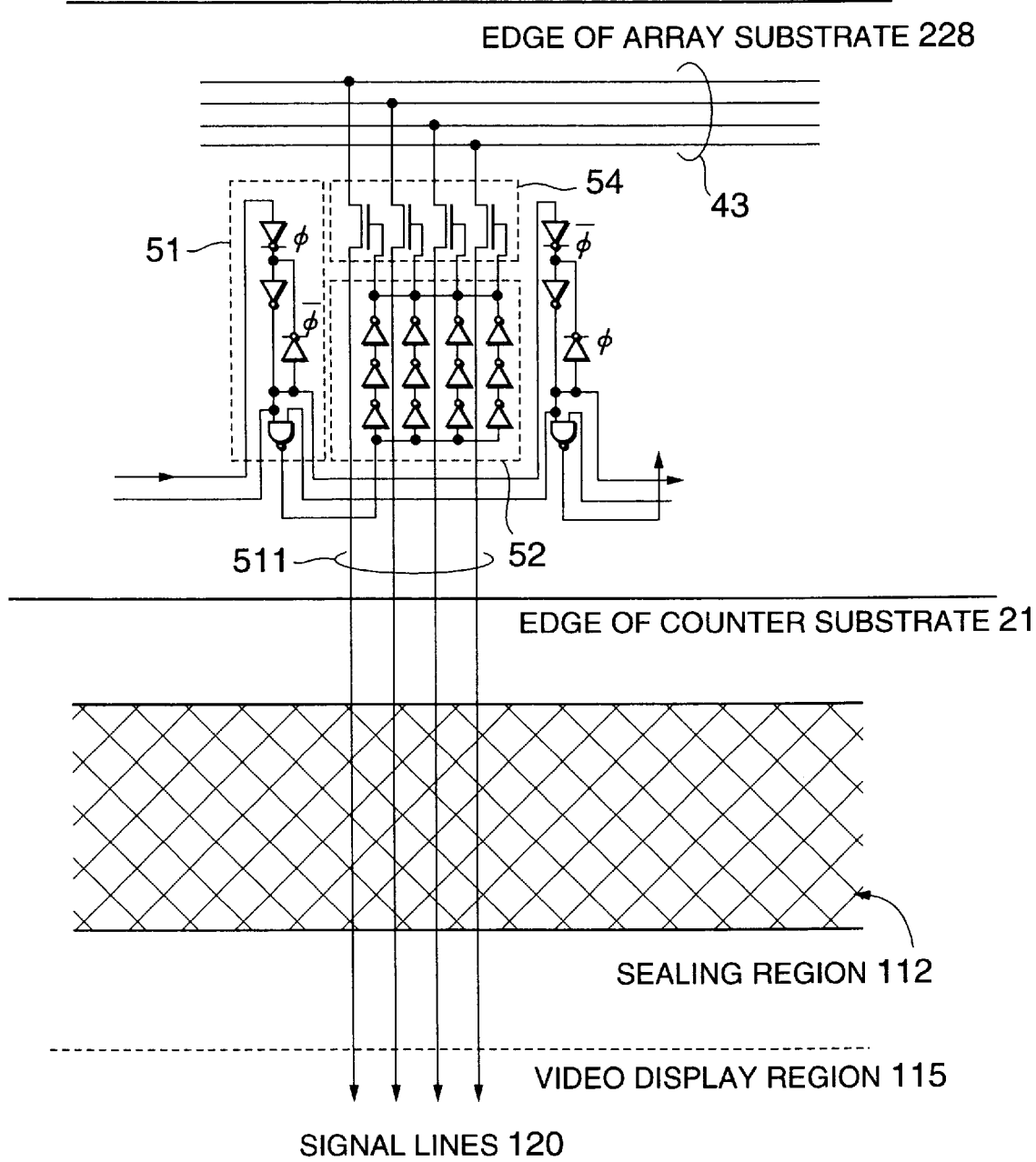

FIG. 5 shows a fourth embodiment signal line driving circuit of an integrated driver circuit type liquid crystal display device according to the present invention. A timing signal generator circuit 51, buffer circuits 52, and analogue switches 54 are disposed on the inside of video busses. Output lines 511 of the analogue switches 54 are put together to minimize interference with the timing signal generator circuit. Since this structure enables the output lines of the analogue switches to overlap less with the timing signal generator circuit than in the case of the second embodiment, the circuit layout is much easier, mistakes in engineering design can be avoided and the device production yield can also be improved.

FIG. 6 shows a fifth embodiment signal line driving circuit of an integrated driver circuit type liquid crystal display device according to the present invention. Although the structure of the signal line driving circuit is substantially the same as that of the second embodiment, the array substrate 228 is provided entirely opposite to the counter substrate 21 and the driving circuit is disposed on the array substrate 228. Video busses 63 and analogue switches 64 are provided in the sealing region 112. A timing signal generator circuit 61 is provided on the outside of the sealing region 112 but buffer circuits 62 are provided between the sealing region 112 and the video display region 115.

The busses 63 and the switches 64 are covered with the sealing material while the components 63 and 64 are covered with the liquid crystal in a conventional device. The dielectric constant of the former is usually smaller than the latter. Thus, the structure of this embodiment is capable of reducing parasitic capacitance defined between the driving circuit and the counter electrodes of the counter substrate 21 and/or lines of the array substrate 228 more than that of the conventional device. It prevents the bandwidth characteristics from being poor without substantial change of the sealing region 112 and also provides the device with narrower frame portions.

FIG. 7 shows a sixth embodiment signal line driving circuit of an integrated driver circuit type liquid crystal display device according to the present invention. As shown, the array substrate 228 is provided entirely opposite to the counter substrate 21 and the driving circuit is disposed on the array substrate 228. Video busses 73 and analogue switches 74 are provided in the sealing region 112. A timing signal generator circuit 71 is provided on the outside of the sealing region 112 but buffer circuits 72 are provided between the sealing region 112 and the video display region 115. The edge of the common electrode 714, however, is disposed not to cover either the busses 73 or the switches 74 but partially the buffer circuits 72.

Since the video busses 73 are provided in the pheripheral portion of the array substrate 228, the common electrode 714 can be disposed to avoid the video busses 73 and the analogue switches 74 even where the production processes thereof are less in accuracy than those of the conventional device. As a consequence, the bandwidth characteristics can be improved with lower cost kept.

Obviously, the present invention is not limited to the embodiments. The components on the array substrate may be formed by using methods different from the embodiment. As far as the bus and circuit configurations and the cell structure have substantially the same functions as described, various alternative arrangements may be made to achieve substantially the same performance. The N-type analogue switches may be P-type and/or transfer gate-type. It is possible to combine the embodiments so that the bandwidth characteristics can be improved. Further, driving capability emphasis circuits may also connected between the analogue switches and the signal lines at the display region to emphasize the buffer circuits so that the bandwidth characteristics can be improved.

According to one aspect of the present invention, only the single output line of the timing signal generator circuit crosses the video busses to distribute the timing signal to the buffer circuits and the analogue switches. Alternatively, according to another aspect to the invention, the output signal line does not cross the video signal busses at all. Thus, it can minimize the crossing area between the output signal line and the busses or has nothing to do therewith. The parasitic capacitance of the busses is reduced so that the bandwidth characteristics of the busses can be improved and a good display can be obtained without an increase of the driving circuit occupied area.

What we claim is:

1. An integrated driver circuit type liquid crystal display device, comprising:
   an array substrate;
   a counter substrate provided opposite to said array substrate with a gap;
   a liquid crystal provided in said gap;
   a sealing region;
   a sealing material covering said sealing region to seal said liquid crystal in said gap;
   a video display region including a plurality of signal lines disposed on said array substrate;
   video signal busses to transmit video signals;
   a timing signal generator circuit disposed on said array substrate to generate a timing signal;
   switches disposed on said array substrate to supply video signals from said video busses to said signal lines in response to the timing signal;
   parallel buffer circuits disposed on said array substrate to provide said switches with the timing signal from said timing signal generator circuit; and
   output signal lines to transmit said timing signal from said timing signal generator to said buffer circuits,
   wherein said buffer circuits and said switches are disposed closer to said video display region than said video signal busses and either said buffer circuits or said switches are not crossed with said video signal busses.

2. The integrated driver circuit type liquid crystal display device according to claim 1, wherein said buffer circuits and said switches are disposed between said video busses and said video display region.

3. The integrated driver circuit type liquid crystal display device according to claim 1, wherein said timing signal generator circuit is disposed at the edge of said array substrate, and wherein said output signal lines are connected to said timing signal generator circuit and include a single output signal line through which the timing signal is transferred to said buffer circuits.

4. The integrated driver circuit type liquid crystal display device according to claim 1, wherein said counter substrate does not cover said video busses, said timing signal generator circuit, said switches, and said buffer circuits.

5. The integrated driver circuit type liquid crystal display device according to claim 1, wherein said counter substrate cover said video busses, said timing signal generator circuit, said switches, and said buffer circuits.

6. The integrated driver circuit type liquid crystal display device according to claim 1, wherein said video busses are disposed at the edge of said array substrate, and wherein said timing generator circuit, said switches, and said buffer circuits are disposed between said video busses and said video display region.

7. The integrated driver circuit type liquid crystal display device according to claim 1, wherein said busses and said switches are disposed on said sealing region.

8. The integrated driver circuit type liquid crystal display device according to claim 1, wherein said counter substrate further includes a common electrode which does not cover either said video busses or said switches.

* * * * *